United States Patent [19]

Costas

[11] Patent Number: 4,807,174

[45] Date of Patent: Feb. 21, 1989

[54] APPARATUS AND METHOD FOR QUANTIZING A SET OF WEIGHTS FOR A WEIGHTED SUM SIGNAL PROCESSING SYSTEM

[75] Inventor: John P. Costas, Waban, Mass.

[73] Assignee: Cogent Systems, Inc., Waban, Mass.

[21] Appl. No.: 781,241

[22] Filed: Sep. 27, 1985

[51] Int. Cl.⁴ ............................................. G06F 15/31
[52] U.S. Cl. ........................... 364/724.03; 364/724.19
[58] Field of Search ............... 364/715, 724, 715.01, 364/715.03, 724.01, 724.03, 724.19, 724.2

[56] References Cited

U.S. PATENT DOCUMENTS

| | | | |
|---|---|---|---|
| 4,053,754 | 10/1977 | Berlin et al. | 364/723 |
| 4,237,554 | 12/1980 | Gitlin et al. | 364/724 |
| 4,349,889 | 9/1982 | van den Elzen et al. | 364/724 |
| 4,539,536 | 9/1985 | White | 364/724 |
| 4,580,275 | 4/1986 | Pirani et al. | 364/724 |
| 4,627,072 | 12/1986 | Ryu et al. | 364/724 |

OTHER PUBLICATIONS

Hawksford et al, "Adaptive Mean-Square-Error Transversal Equaliser," IEEE Proc. vol. 128, Pt F, No. 5 pp. 296-304 Oct. 1987.

Primary Examiner—Gary V. Harkcom
Assistant Examiner—Dale M. Shaw
Attorney, Agent, or Firm—Joseph S. Iandiorio; Douglas E. Denninger

[57] ABSTRACT

A conversion apparatus for quantizing a set of weights for a weighted sum signal processing system, including a predetermined number of conversion arrays operable in succession and a transfer and monitor circuit. Each conversion array stores a plurality of values to be converted, quantizes the values to be converted to produce a set of discrete values and a set of error values and replaces the contents of the means for storing with the set of discrete values. Each conversion array also combines the set of error values with a set of interpolator weights to form a transformed error set. The transfer and monitor circuit successively combines the transformed error set most recently formed with the contents of a successive conversion array, monitors the successively produced sets of error values, and halts the successive conversions and combinations when a predetermined condition is satisfied. The invention also features a method of quantizing such a set of weights.

28 Claims, 8 Drawing Sheets

QUANTIZER LOGIC

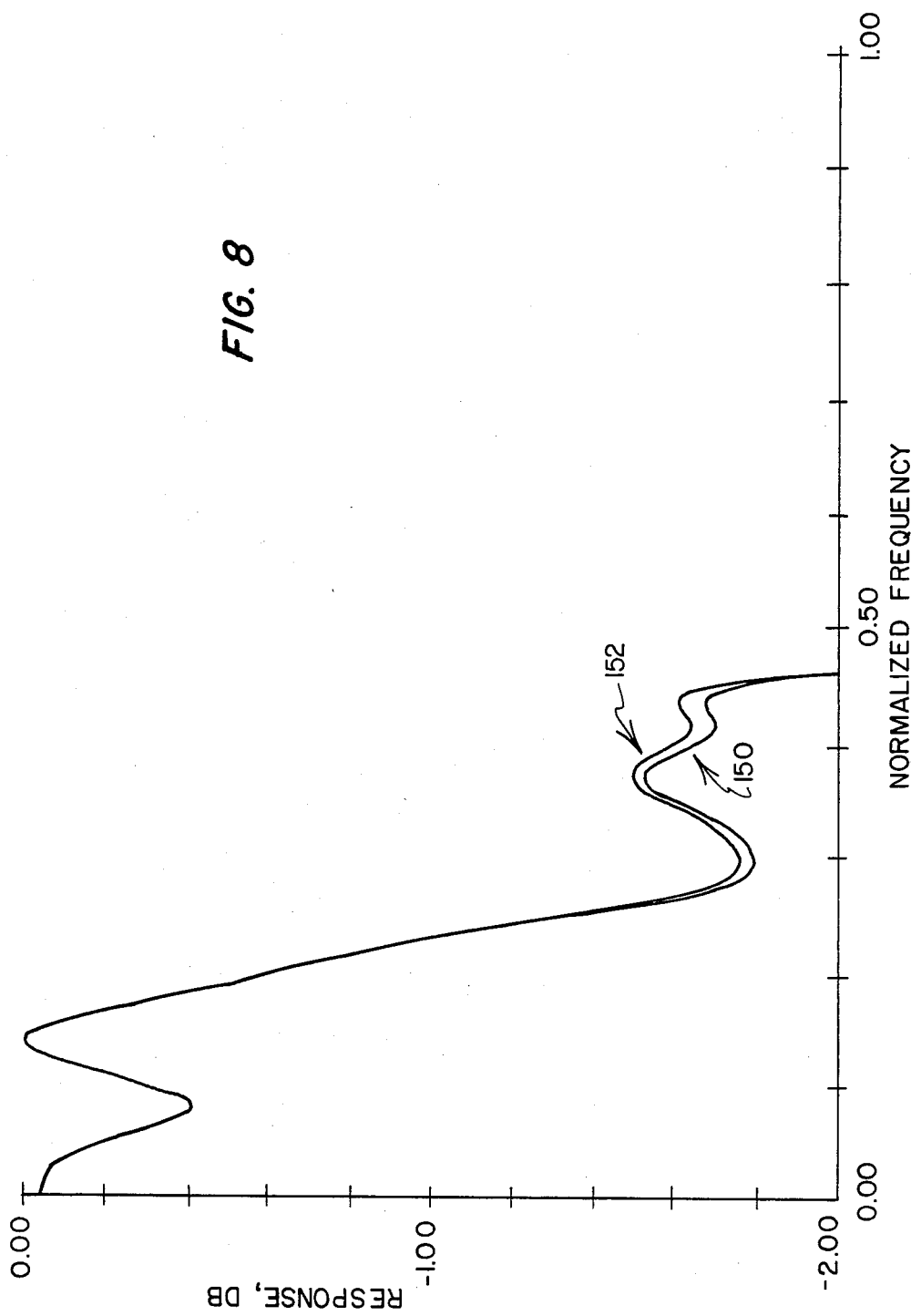

APPARATUS AND METHOD FOR QUANTIZING A SET OF WEIGHTS FOR A WEIGHTED SUM SIGNAL PROCESSING SYSTEM

FIELD OF INVENTION

This invention relates to an apparatus and method for converting an initial set of weights for use in a weighted sum system into a converted set of weights. The frequency-domain behavior of the weighting afforded by the initial set of weights and the weight sets converted according to this invention are similar over a specified spectral region. A novel signal processor implements the converted weight sets with simple shift devices instead of multipliers and therefore operates more rapidly.

BACKGROUND OF INVENTION

There are a number of applications in which a set of values is transformed into a set of weighted sums where each weighted sum is produced by individually multiplying a number of the values with a set of weights and summing the individual product values. One such application is in the field of signal processing. Presently, multipliers are used to multiply successive signal values by the set of weights. Multipliers, while operating at ever higher speeds, typically remain the slowest link in the signal processing chain. Binary multiplication is accomplished swiftly in digital processing but not swiftly enough in many environments where data input and sampling rates are extremely high. Further, digital multipliers are power consumptive.

Attempts to diminish the obstacle of multiplier speed are approached from at least three directions. One is the ongoing attempt to build ever faster multipliers. Another is to use fewer multipliers by reducing the number of weights and thus the number of multipliers required to implement the weights. Reducing the number of weights, however, significantly decreases the accuracy of the signal weighting.

Yet another attempt is to limit the number of nonzero digits of each weight value such as by quantizing each weight value to be multiplied: in quantizing, the value is converted into one of a set of discrete values having few nonzero digits. As presently implemented, however, accuracy is greatly diminished by this approach.

A typical area where the problem of multiplier speed arises is in filtering using coefficient multiplication of delayed signal samples. A signal processor takes signals over a time window, that is, a time period, and multiplies these values by weights from a weight function such as might be obtained from a handbook. Reduction in the number of non-zero digits of the multiplier coefficients by conventionally quantizing them loses part of the information required to maintain acceptable filter performance.

SUMMARY OF INVENTION

It is therefore an object of this invention to provide an improved apparatus for and method of quantizing an initial set of weights utilized in a signal processor to produce converted sets of weights which replace the initial set of weights.

It is a further object of this invention to provide such converted weight sets which are utilizable with simple shift devices instead of multipliers.

It is a further object of this invention to provide such converted weight sets which significantly increase the speed of the signal processor.

It is a further object of this invention to provide such converted weight sets which maintain accuracy in signal processing.

The invention results from the realization that a truly effective, improved digital filter can be achieved by quantizing the set of weights used in a conventional filter into two or more sets of discrete weight values which can be implemented by the improved filter using simple shift devices instead of multipliers. Preferably, each discrete weight value has a single nonzero digit.

This invention features a conversion apparatus for quantizing a set of weights for a weighted sum signal processor system. There are a predetermined number of conversion arrays operable in succession. Each conversion array includes means for storing a plurality of values to be converted, means for quantizing the values to be converted to produce a set of discrete values and a set of error values and for replacing the contents of the means for storing with the set of discrete values. Each array also contains transformation means for combining the sets of error values with a set of interpolator weights to form a transformed error set. There is also transfer means, responsive to each conversion array, for successively combining the transformed error set most recently formed with the contents of a successive conversion array and for monitoring the successively produced sets of error values. The transfer means halts the successive conversions and combinations when the sets of error values diminish to a predetermined magnitude.

In one embodiment, the transformation means includes interpolation means for combining selected values with a set of interpolator weights, first means for selecting a first group of alternate values from each error value set which are combined by the interpolation means to form a first interpolated group, second means for selecting a second group of alternate error values, consisting of the remaining error values in that error value set, which are combined by the interpolation means to form a second interpolated group, and adder means for combining the first and second interpolated groups to form a transformed error set. The interpolation means may include a smoothing device and each transformation means may further include means for providing a plurality of zero values to the interpolation means. The adder means may include means for reducing by a predetermined amount the magnitude of each value of each interpolated group. Each error value set has a center position and the transformation means includes means for aligning the error value set into a transformed error set having a center position corresponding in alignment with the center position of that error set. The transfer means may place the center position of the transformed set into the same position in the successive means for storing as the position in which the previous transformed set was placed.

In a preferred embodiment, each error set represents the difference between the quantized set and the set which was quantized. The contents of a storage means that is quantized, the resulting quantized set, and the resulting error set have the same number of values. The means for quantizing selects a discrete value from L cells of numerical values according to the formulas $$C_k = 10^{\frac{-P}{20}(k-1)}$$

$$B_k = 10^{\frac{-P}{40}(2k-1)}$$

$$k = 1, 2, 3, \ldots, L - 1$$

and $$C_L = 0$$

where $C_k$ is the discrete value for the $k^{th}$ cell, $B_k$ is the lower boundary of the kth cell, P is a quantization parameter selected to provide a desired result and L is the number of cells. In one embodiment, $P = 20 \log_{10}(p)$ and $p = 2$ where p is the radix of the numerical system. The contents of each means for storing is re-quantized at least once. Each discrete value produced by the means for quantizing has a single non-zero digit.

This invention also features a method of quantizing an initial set of weights, including quantizing the initial set of weights to obtain a first quantized set and a first error set, placing the first quantized set into a first storage means of a predetermined number of storage means, transforming the first error set into a first transformed error set, and producing and entering successive quantized sets into the remaining storage means by iteratively, until a quantized set is placed into the last of the storage means, quantizing the transformed error set resulting from the most recent transformation to obtain a resulting quantized set and a resulting error set, placing the resulting quantized set into a succeeding storage means, and transforming the resulting error set into a resulting transformed error set. The method further includes incrementing the most recently transformed error set into one of the storage means now occupied by a quantized set, and repeatedly, until a predetermined condition is satisfied, quantizing the contents of each successive storage means to obtain a revised quantized set and a revised error set, replacing the contents of that storage means with the revised quantized set, transforming the revised error set into a revised transformed error set, and incrementing the revised transformed error set into the next storage means.

In one embodiment, quantizing provides a set of quantized values each represented by a discrete value of a set of discrete values. Each discrete value may be represented by a single non-zero digit in a numerical system such that the discrete values are selected from L cells of numerical values according to the formulas $$C_k = 10^{\frac{-P}{20}(k-1)}$$

$$B_k = 10^{\frac{-P}{40}(2k-1)}$$

$$k = 1, 2, 3, \ldots, L - 1$$

and $$C_L = 0$$

where $C_k$ is the discrete value for the $k^{th}$ cell, $B_k$ is the lower boundary of the kth cell, P is a quantization parameter such as $P = 20 \log_{10}(p)$, where p is the radix of the numerical system and L is the number of cells. The numerical system may be a binary system such that $p = 2$.

In a preferred embodiment, transforming includes combining the error values of each error set with a set of interpolator weights such that a first group of alternate error values is selected from each error set and is combined with the set of interpolator weights in a first interpolation procedure to form a first interpolated group, a second group of alternate error values, consisting of the remaining error values in that error set, is selected and combined with the set of interpolator weights in a second interpolation procedure to form a second interpolated group, and the first and second interpolated groups are combined to form a transformed error set. Each error set has a center position and is transformed into a transformed set having a center position corresponding in alignment with the center position of that error set, the transformed set having a greater number of values distributed about the corresponding center position. Adding the transformed error set into the next storage means places the center position of the transformed error set into the same position as the position in which the previous transformed error set was placed.

This invention further features a method of quantizing an initial set of weight signals including quantizing the initial set of weight signals to obtain a first quantized set of signals and a first error set of signals, placing the quantized set into a first storage means, transforming the first error set into a first transformed error set of signals, and quantizing the first transformed error set to obtain a second quantized set and a second error set. The method further includes placing the second quantized set into a second storage means, transforming the second error set into a second transformed error set, incrementing the second transformed error set into the first storage means, and repeatedly, until the values of the error sets diminish to a predetermined magnitude, quantizing the contents of each storage means to obtain a resulting quantized set and a resulting error set, replacing the contents of that storage means with the resulting quantized set, transforming the resulting error set into a resulting transformed error set, and incrementing the resulting transformed error set into the next storage means.

DISCLOSURE OF PREFERRED EMBODIMENT

Other objects, features and advantages will occur from the following description of a preferred embodiment and the accompanying drawings, in which:

FIG. 8 is a chart of normalized frequency and response in decibels for digital filters implementing the initial set of weights of Table II and the converted set of weights of Table III.

The invention may be accomplished by an apparatus and method which cyclically process an initial set of weights, such as a set of weights to be utilized in a digital filter, to produce a plurality of converted weight sets which can be utilized in an improved, more rapid digital filter. Each value in the converted sets of weights is a discrete value, preferably a value having a single nonzero digit. The apparatus and method according to this invention repeatedly quantize a set of initial weight values to produce a series of quantized sets and error sets, store each quantized set of weights in a storage array, transform each error set into a transformed set, and add each transformed set to a succeeding storage array.

After a predetermined number of storage arrays have received a transformed set and subsequently had that transformed set quantized, the next transformed set is added to a storage array already occupied by a quantized set. Each quantized set is requantized after a transformed set is added to it to produce a resulting quantized set and a resulting error set. The process is continued until the error sets are sufficiently diminished in size; at this point, the several quantized sets represent the converted sets of weights which replace the initial set of weights.

Unlike the initial set of weights, the converted sets of weights require only simple shift devices for implementation when each discrete value has only a single nonzero digit. An improved signal processor utilizes a plurality of converted sets of weights to rapidly process signal values. Each converted weight value in each converted weight set is a discrete term, preferably having a single nonzero digit; typically, the initial weight values are continuous terms. Each converted weight value also contains a sign command which indicates whether a signal value being shifted should also be negated.

Figures 1, 2:
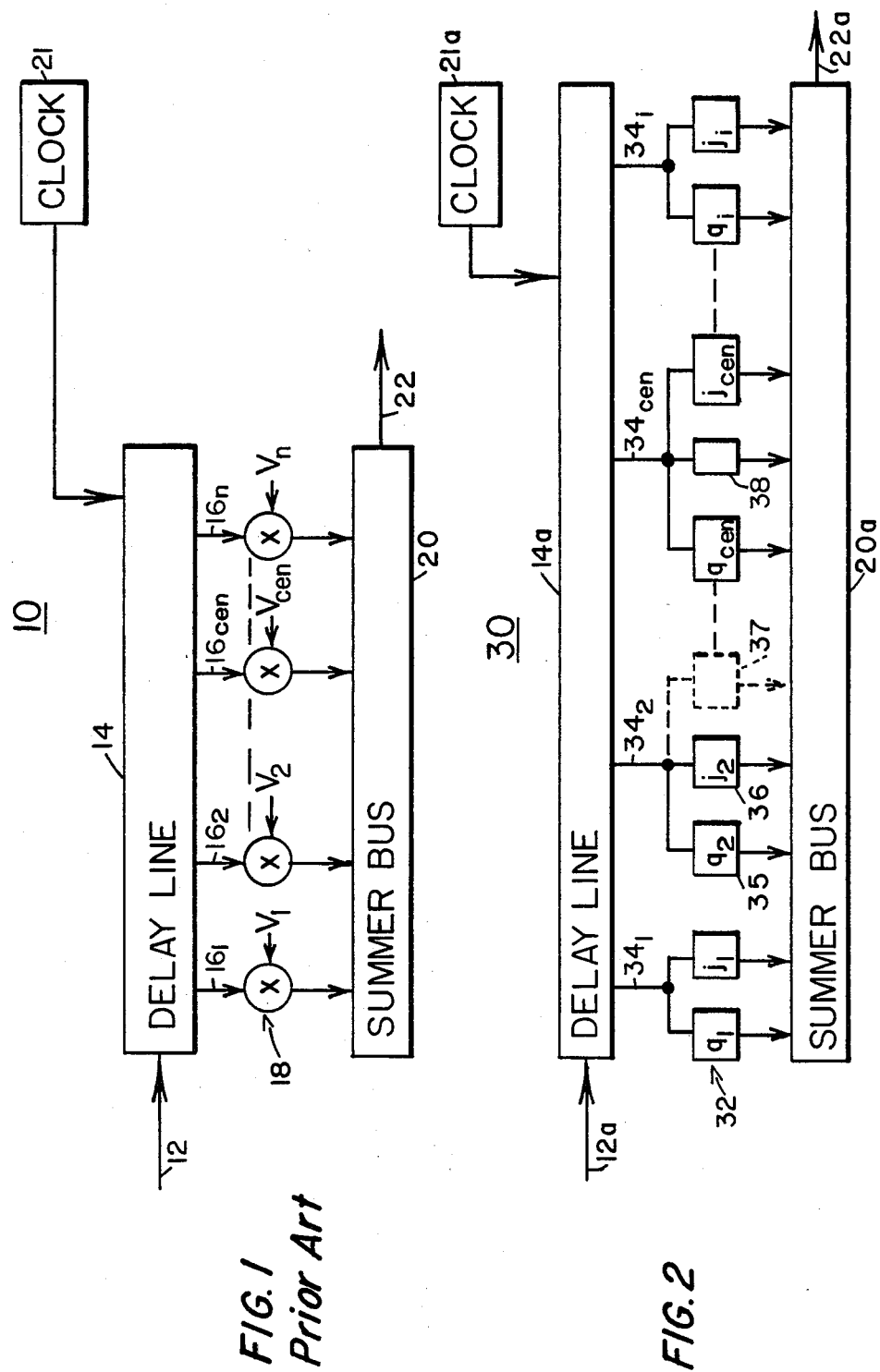
FIG. 1 is a schematic of a conventional signal processor having a plurality of weights implemented with multipliers.
FIG. 2 is a schematic of a signal processor using only shift devices to implement several sets of weights according to this invention.

The difference in implementation of weights converted according to this invention is seen when FIGS. 1 and 2 are compared. Conventional signal processor 10, FIG. 1, receives time-sampled and digitized signal input 12 to delay line 14. As the signal values are stepped through delay line 14, the signal values are accessed through signal taps $16_1$, $16_2$ through $16_n$ where they are multiplied by weight values $V_1$, $V_2$, ... $V_n$ utilizing multipliers 18 and combined in summer bus 20; after each clock period, provided by clock 21, a weighted sum signal value is produced as part of signal output 22.

Each multiplier 18 contains a preselected weight value chosen such that the set of all weights $V_1$ through $V_n$ within multipliers 18 provide a desired weighting of signal values. Weight value $V_{cen}$ implemented by multiplier $16_{cen}$ represents the center of the initial weight set when there is an odd number of values in that set such that there is an even symmetry about weight value $V_{cen}$.

The speed and efficiency of conventional signal processor 10 are limited by multipliers 18. Each multiplier conducts a number of shift-and-add operations. Multipliers 18 are time-consuming and require a relatively large amount of power to multiply the signal values by the set of weights $V_1$ to $V_n$.

In contrast, improved signal processor 30, FIG. 2, uses simple shift devices 32 at taps $34_1$, $34_2$ through $34_i$ from delay line 14a. Each tap provides a digitized signal value from signal input 12a to at least two shift devices, one for each converted weight set $Q_1$ through $Q_X$. Improved signal processor 30 utilizes two sets of converted weights, converted weight set $Q_1$ containing converted weight values $q_1$ through $q_i$ and converted weight set $Q_2$ containing converted weight values $j_1$ through $j_i$. For example, tap $34_2$ provides a signal value to shift devices 35, 36 containing converted weight values $q_2$ and $j_2$, respectively. Improved signal processor 30 is adapted for three converted weight sets by adding an additional shift device to each tap such as shift device 37, shown in phantom, for tap $34_2$.

Preferably, the converted weight value contained in each shift device 32 is a discrete term having a sign command and a single nonzero digit as a shift command. When the sign of the shifted signal value need not be changed, the sign command is simply the absence of a sign change command. Each discrete term has a single nonzero digit such that there are X number of nonzero digits combined with, that is, operative upon, each signal value for X number of converted weight sets.

The output of the shift device is a combined value—a signal value shifted a specified number of places to the right and possibly having its sign changed—which is then summed with all other shift values also combined during each clock period, provided by clock 21a, as weighted sum signal value output 22a. By comparison, conventional signal processor 10, FIG. 1, must multiply—sequentially shift-and-add signal values in each multiplier—and then conduct yet another summing operation to sum all the multiplied signal values to provide weighted sum signal value output 22.

If the original weight set $V_1$ to $V_n$ has an even symmetry about $V_{cen}$, then the converted weight sets $Q_1$ and $Q_2$ will also have an even symmetry about $q_{cen}$ and $j_{cen}$, respectively. The converted weight sets typically have a greater number of values than the original weight set such that $$i > n. \tag{1}$$

Further, when $V_{cen}$ has a value of one, $V_{cen}$ is changed to zero for improved quantizing according to this invention. Shift device 38, FIG. 2, restores the altered central value by restoring a weight of one—a zero shift—for each signal value accessed by tap $34_{cen}$.

In general, one can normalize the original weight set values $V_1$ to $V_n$ so that the maximum value of the normalized weight set becomes unity. This value is then set to zero and quantized sets $Q_1$ to $Q_X$ are generated by conversions according to the invention. The omitted unity term is then accounted for by inserting a zero shift weight at the appropriate tap position such as described above for a central peak value restored by shift 38.

Figure 3:
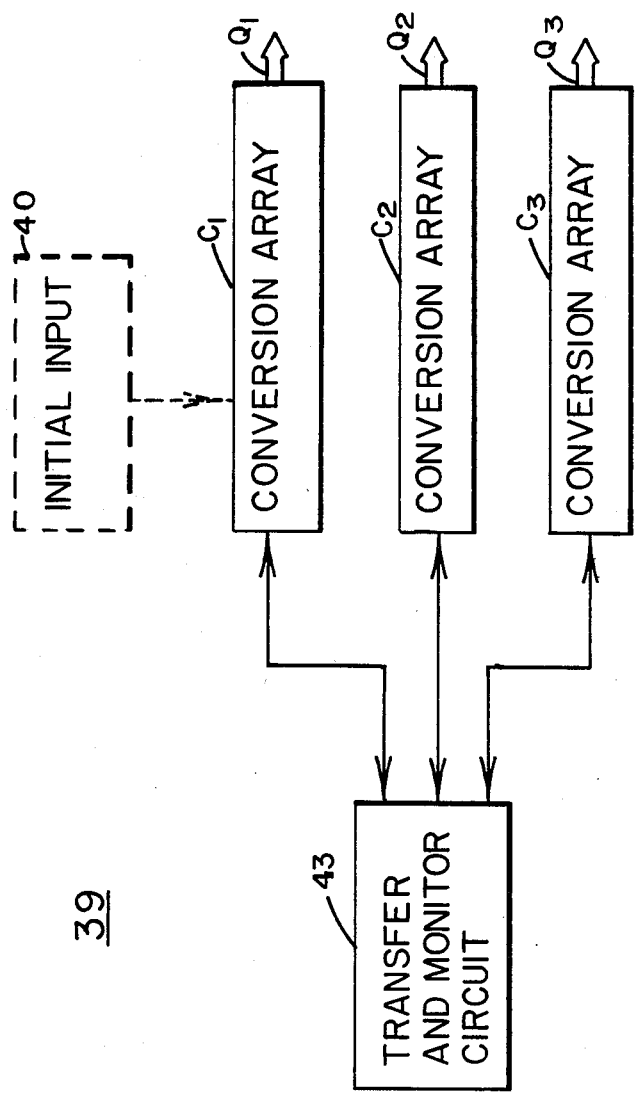
FIG. 3 is a schematic block diagram of an apparatus according to this invention for converting a set of initial weights.

Conversion apparatus 39, FIG. 3, provides converted weight sets $Q_1$, $Q_2$, $Q_3$ from conversion arrays $C_1$, $C_2$ and $C_3$, respectively. Arrays $C_1$, $C_2$ and $C_3$ are initialized to zero. The original set of weight values $V_1$ through $V_n$—continuous weight values to be converted—are then provided as initial input 40 to conversion array $C_1$. The set of values to be converted is quantized in array $C_1$ to produce a set of discrete values and a set of error values representing the residual of the quantization. The discrete value set replaces the current contents of array $C_1$, i.e., the set of values to be converted.

The error value set is transformed into a transformed set and passes to transfer and monitor circuit 43 which places the transformed set into a successive conversion array by additive combination with the current contents of that array. The contents of the newly-incremented array, e.g., array $C_2$, are quantized to produce a discrete value set and a set of error values. The discrete value set—a quantized set—replaces the contents of array $C_2$. The error set is transformed and transfer and monitor circuit 43 adds the transformed set most recently formed with the quantized set of the next conversion array. For example, if conversion arrays $C_1$, $C_2$ and $C_3$ are successively operated in that order, transfer and monitor circuit 43 adds the transformed error set formed from the quantization operation in array $C_3$ with the quantized set extant in conversion array $C_1$. The operations are continued until a predetermined condition is satisfied.

Transfer and monitor circuit 43 determines when the predetermined condition is satisfied. One condition for termination can be a predetermined maximum magnitude to which the peak error value must diminish. Another condition is a maximum number of error values allowable within each conversion array, or a maximum number of cycles among the arrays.

During normal operation, the most recently formed transformed error set from one conversion array is additively combined with the quantized set in another conversion array; the combination is later quantized. When the predetermined condition is satisfied, conversion apparatus 39 ceases operation rather than transform the resulting error set and increment the contents of the next conversion array. The quantized sets in the conversion arrays represent the converted weight sets: conversion arrays $C_1$, $C_2$ and $C_3$ provide converted weight sets $Q_1$, $Q_2$ and $Q_3$, respectively.

Figure 4:
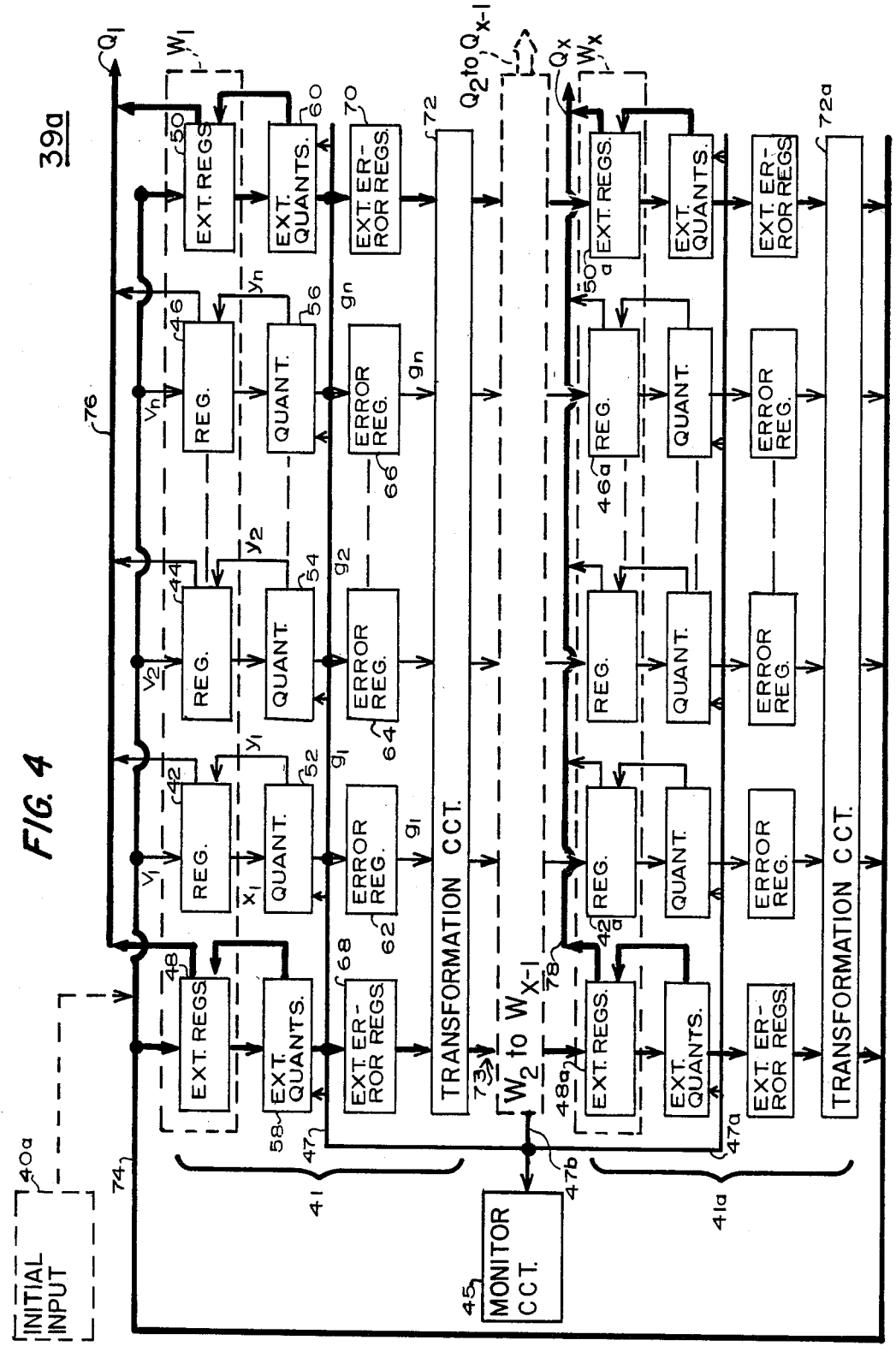
FIG. 4 is a more detailed block diagram of an alternative apparatus according to this invention.

Conversion apparatus 39a, FIG. 4, provides converted weight sets $Q_1$ through $Q_X$ where X is equal to or greater than two; at least two conversion arrays 41, 41a are required. The set of initial weight values $V_1$ through $V_n$ to be converted are provided as initial input 40a to registers 42 and 44 through 46 of storage array $W_1$ which is part of conversion array 41. Initially, no values are placed in extension registers 48 or in extension registers 50. Weight values $V_1$ through $V_n$ are then provided by registers 42 and 44 through 46 to quantizers 52 and 54 through 56, respectively, where each value is quantized into a discrete value of a set of discrete values. The quantization produces an error value representing the difference between the nonquantized value and the discrete value. Each quantized value is returned—to the register which supplied the value to be quantized—to replace the nonquantized value previously in that register; for example, the discrete quantized value from quantizer 52 replaces continuous weight value $x_1$, which initially is $V_1$, in register 42. Extension quantizers 58 and 60 are not accessed at this time since registers 48 and 50 have not yet been activated. The error values are provided to line 47 of monitor circuit 45 which compares the magnitude of the peak error value to a predetermined magnitude. Monitor circuit 45 also halts operation of apparatus 39a when growth of the number of error values exhausts the capacity of the extension registers.

The difference between nonquantized value $x_1$ previously in register 42 and quantized value $y_1$ is error value $g_1$ which, after being provided to line 47, passes to error register 62. Similarly, quantized value $y_2$ is placed into register 44 while error value $g_2$ is placed in error register 64 and, in quantizer 56, quantized value $y_n$ is placed in register 46 while error value $g_n$ is placed in error register 66. Extension error registers 68 and 70 are not yet activated. Error values $g_1$ through $g_n$ are provided to transformation circuit 72 where the error values are transformed as described below.

The operation within conversion array 41 is repeated in successive conversion arrays as each transformed error set is placed into register arrays $W_2$ through $W_{X-1}$ as indicated in phantom. A transformed set of error values from transformation circuit 72 or, when more than two conversion arrays are used, a transformed set from an intermediate array, is placed into conversion array 41a by transfer bus 73. Alignment is maintained such that a transformed error value derived from initial value $V_1$ is placed into register 42a while the transformed value derived from error value $g_n$, which was in turn derived from the original weight value $V_n$, is placed into register 46a. Where $X=2$, the transformed set of error values derived from transformation circuit 72 is placed directly into storage array $W_X$ of conversion array 41a.

Extension registers 48a and 50a are utilized as well. As described below, the action of transforming produces a transformed error set having a greater number of values than the input error set.

Quantizing the contents of each active register in storage array $W_X$ is such that each value of the quantized set is replaced into its respective register while the resulting error value is placed into its respective error register and then transformed in transformation circuit 72a to form a resulting transformed set.

The set of transformed error values obtained from transformation circuit 72a is then added to the contents of storage array $W_1$ as indicated by transfer bus 74. This procedure is repeated in cyclic fashion until the values of the error sets diminish in magnitude, preferably until the values diminish substantially. Monitor circuit 45 monitors the magnitudes of the resulting error value sets as sampled by lines 47, 47b, and 47a, and compares the magnitudes to a predetermined magnitude. When the magnitudes diminish to that predetermined magnitude, monitor circuit 45 ceases operation after the just-completed quantization as described below.

Although the conversion operation of successively quantizing and transforming is described for conversion apparatus 39a as sequential, the storage array into which the most recently transformed set is placed need not be the next sequential storage array. For example, if $X=3$ such that three storage arrays $W_1$, $W_2$, and $W_3$ are utilized by conversion apparatus 39, the third transformed set—produced by transforming the error set obtained when the contents of storage array $W_3$ are quantized—can be added to the contents of storage array $W_2$ instead of storage array $W_1$. That is, the processing order can be $W_1$, $W_2$, $W_3$, $W_2$, $W_3$, $W_2$, $W_3$ . . . or any other random sequence of $W_X$ arrays.

After a transformed set is provided by one of the conversion arrays of conversion apparatus 39a, the storage array receiving the transformed set contains a mixed set of quantized values incremented by transformed error values while the other storage arrays contain only quantized values. When the resulting error values are sufficiently small in magnitude or when other predetermined conditions are satisfied, as detected by monitor circuit 45, conversion apparatus 39a ceases operation after the just-completed quantization in the array containing the mixed set of values, thus providing converted weight sets $Q_1-Q_X$. For example, where $X=2$ such that conversion arrays 41 and 41a are the sole arrays utilized in the instant procedure and the predetermined condition is satisfied, as detected on line 47a, the process within conversion array 41a is suspended after quantization; the just-derived error set is not transformed and the alternate storage array $W_1$ is not incremented. Converted weight value sets $Q_1$ and $Q_2$ are read out on lines 76, 78, respectively.

Figure 5A:
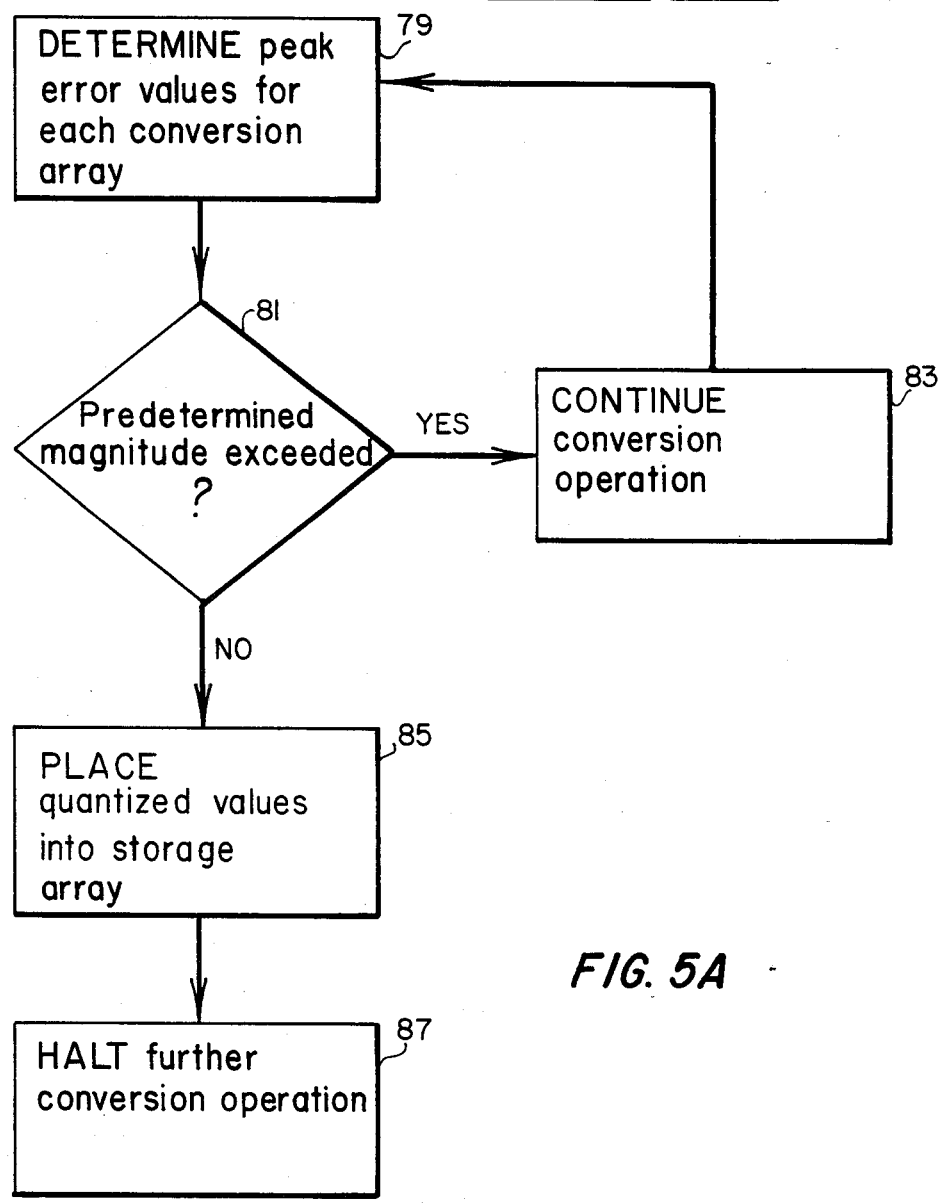
FIG. 5A is a flow chart of logic performed in the monitor circuit of FIG. 4.

The logic performed by monitor circuit 45, FIG. 4, is shown in FIG. 5A. Each value set passes to the monitor circuit where the values are examined, step 79. The peak error value is compared to the predetermined error magnitude value, step 81, before the most recently formed error value set is transformed into a transformed set. If the predetermined value is exceeded conversion operation continues, step 83. When the predetermined value is not exceeded, the monitor circuit commands the quantizers to place the quantized values back into the storage array, step 85, and halts further conversion operation, step 87. At that point the quantized sets represent the converted weight sets.

Figure 5B:
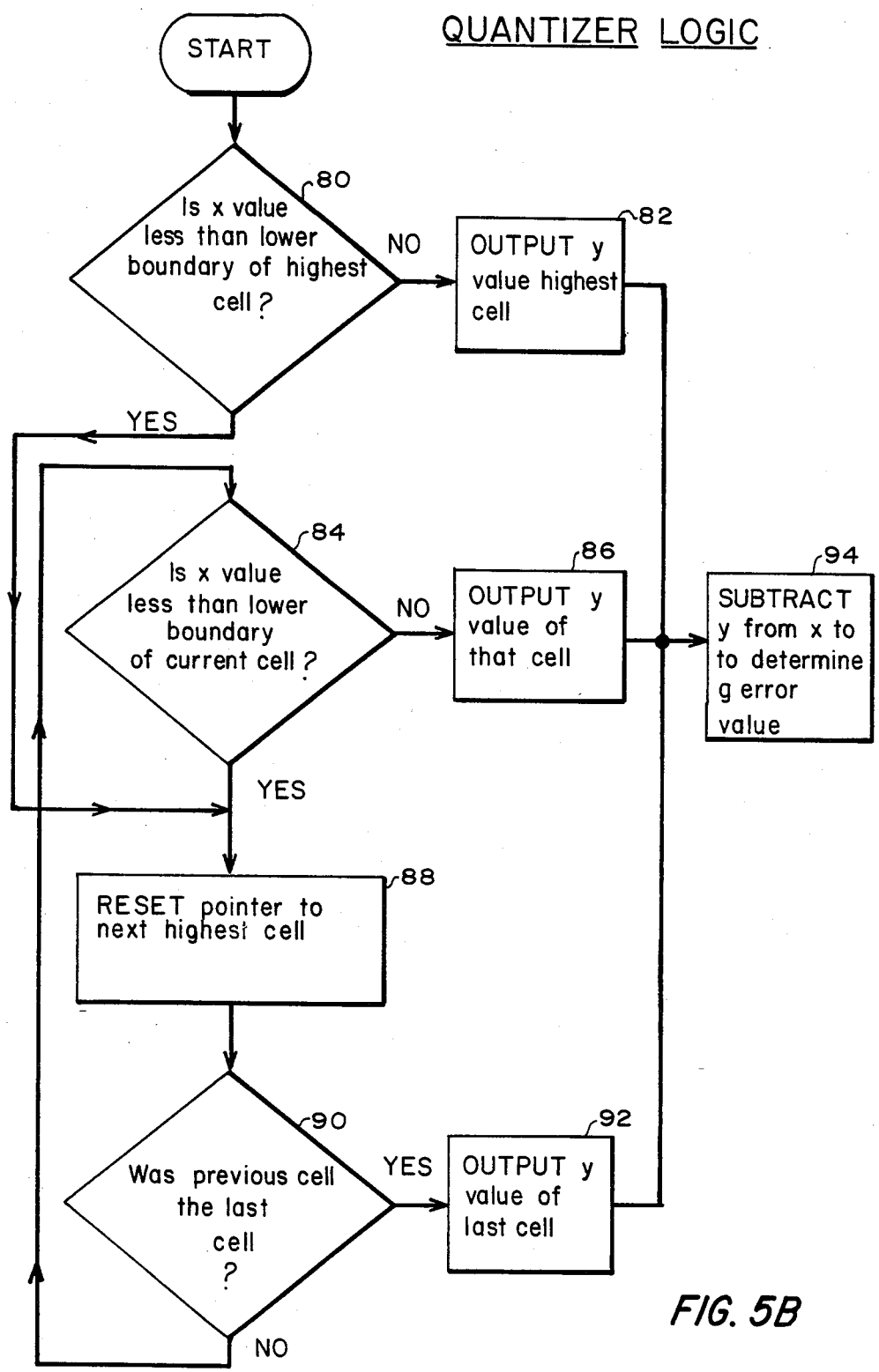
FIG. 5B is a flow chart of logic performed in the quantizers of FIG. 4.

The logic performed by each quantizer is depicted in FIG. 5B. Each quantizer utilizes numerical cells defined by two tables, one containing the lower boundary values $B_k$ of the kth cell and the other containing cell output values $C_k$. A cell pointer is initially set to indicate the highest cell. Each cell has a discrete output value. When an x value is provided from a register of the storage array of the conversion array in which the quantizer is located, the x value is initially compared to the lower boundary value $B_k$ of the highest cell, step 80. If the value is equal to or greater than this lower boundary, the discrete y value of that highest cell is output, step 82. If the x value is less than the lower boundary of the highest cell, the cell pointer is reset to the next highest cell, step 88. The x value is then compared to the lower boundary of the next highest cell, step 84. If the x value is equal to or greater than this new lower boundary, the y value of that cell is output, step 86, and the quantization operation ends. Otherwise, the quantizer proceeds to the next highest cell, step 88 and determines if the previous cell was the last cell, step 90. The quantizer returns to step 84 unless the last cell was reached at which point the quantizer outputs the y value of that last cell, step 92.

After the discrete y value is provided, the y value is subtracted from the x value to determine error value g, step 94. Error value g is then provided to the transformation circuit of that conversion array; quantization continues in successive conversion arrays until the predetermined termination condition is satisfied and the conversion process is halted.

The lower boundary values $B_k$ and the cell output values $C_k$ can represent uniform quantization where the set of discrete y values are equispaced. In some applications, such as in providing converted weights for a digital filter, a logarithmic quantization procedure is desirable. As discussed in detail below, the logarithmic quantization procedure acts upon the magnitude of the x value: the sign, if negative, is removed, stored, and recombined after the procedure is completed. For example, the lower boundary of the $k^{th}$ cell of a system having L cells is $$B_k = 10^{\frac{-P}{40}(2k-1)} \qquad (2)$$

and the cell output value is $$C_k = 10^{\frac{-P}{20}(k-1)} \qquad (3)$$

where P is a quantization parameter selected to provide a desired quantization result, $$k=1, 2, 3, \ldots, L-1 \qquad (4)$$

and $C_L$ is defined to be zero:

$$C_L=0. \qquad (5)$$

It is desirable to define P in terms of the radix p, that is, the base of the computational system to be utilized, such that $$P=20 \log_{10}(p). \qquad (6)$$

When equation (6) is substituted for P in equation (3), the cell output becomes $$C_k = \left[\frac{1}{p}\right]^{(k-1)}, k = 1, 2, 3, \ldots, L-1. \qquad (7)$$

In a number system having p as the radix $$C_k=1, 0.1, 0.01, 0.001, \ldots \text{ (base p)} \qquad (8)$$

Figure 6:
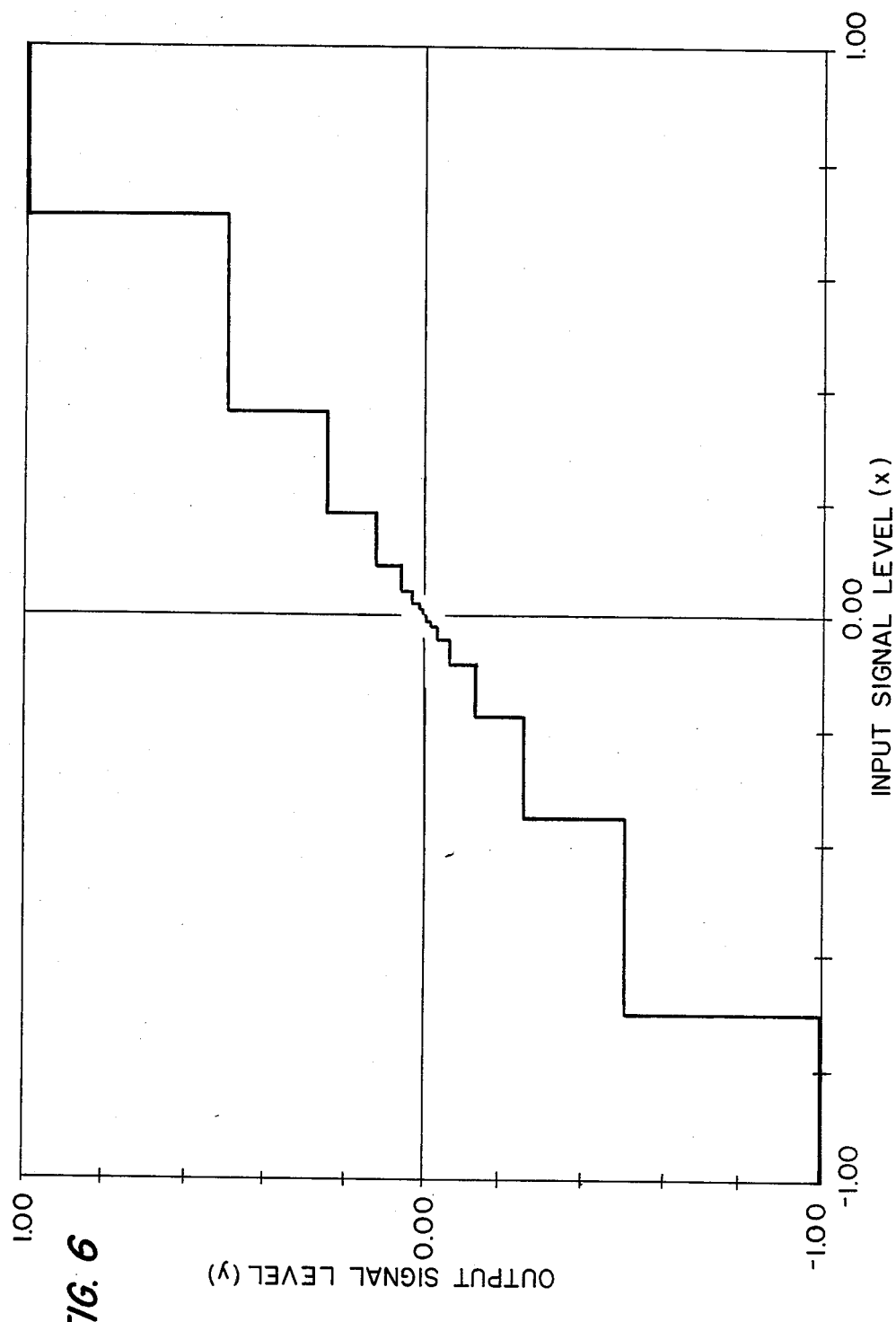
FIG. 6 is a graph of x input and y output for one of the quantizers of FIG. 4.

The x signals and corresponding discrete y output values in the binary computational system for $p=2$ are presented in FIG. 6 where $$P=20 \log_{10}(2)=6.0206 \qquad (9)$$

and $$L=16 \qquad (10)$$

and $$B_k = \sqrt{2}/2^k \qquad (11)$$
$$= 0.707, 0.354, 0.177, \ldots, 0.000043 \text{ (base ten)}$$

and the output for each cell, represented in base ten, from Equations (7) and (5) is $$C_k=1, 0.5, 0.25, 0.125, \ldots, 0.000061, 0.0 \qquad (12)$$

where $$k=0, 1, 2, \ldots 15, 16. \qquad (13)$$

The y values, $C_k$, are reciprocals of powers of two and can be represented by a binary fraction having a single nonzero value.

Equations (11) and (12) define the positive x input and resulting y output for positive x values as depicted in the upper right-hand quadrant of FIG. 6. When the sign of the x value is negative, that negative sign is appended to the output to generate the lower left-hand quadrant. In other words, the sign of the x value is removed and stored so that only the magnitude of the x value is considered by the quantizer logic of FIG. 5B; the sign is then added to outputs 82 or 86. Output step 92 then provides zero as the y value of the last cell. If the input signal has a value between 0.707 and 1, as shown in FIG. 6, the output signal is 1; for an input of −0.707 and −1.0, the output voltage is −1. For inputs from 0.354 to 0.706, the output is 0.5; in the binary number system, this output value is represented as 0.1. A continuous range of x values thus produces specific quantized outputs. The input x values are often pre-normalized so that the peak magnitude value is unity.

Figure 7:
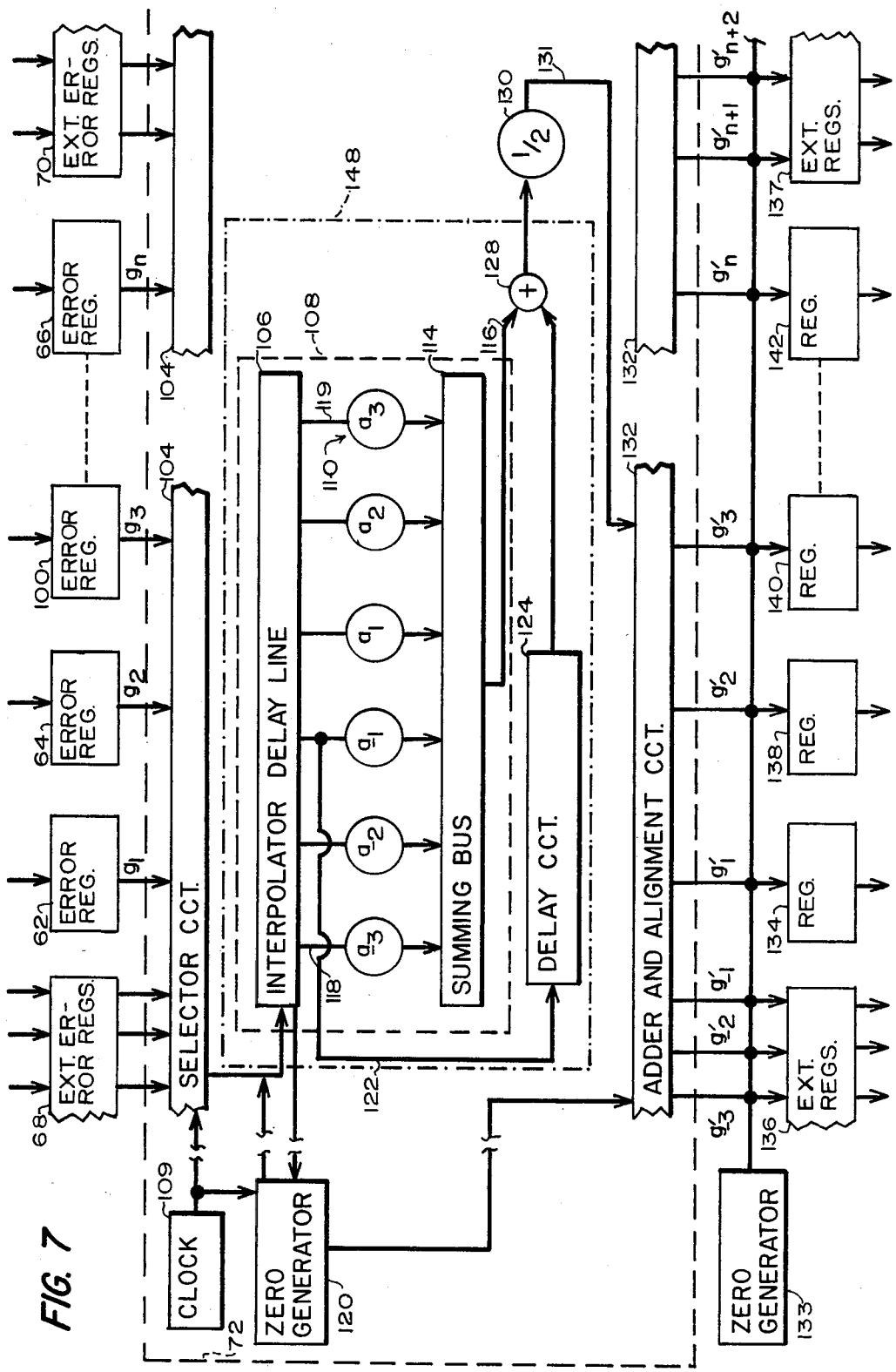
FIG. 7 is a schematic block diagram of the transformation circuit of FIG. 4.

Transformation circuit 72 of FIG. 4 is shown in greater detail in FIG. 7. As described above, upon initial entry error values $g_1$ and $g_2$ are submitted to transformation circuit 72 by error registers 62 and 64, respectively. Error value $g_1$ derives from $V_1$ and $g_2$ is derived from $V_2$. Error register 100 submits error value $g_3$, derived from original weight value $V_3$, and so on until, at error register 66, $g_n$ is submitted. The second and subsequent times that conversion array 41 is accessed, extension error registers 68 will contain error values $g_{-1}$, $g_{-2}$, $g_{-3}$ and so on while extension registers 70 contains $g_{n+1}$, $g_{n+2}$ and so forth.

All error values are submitted to selector circuit 104 which selects the first error value within extension registers 68 or, during the first pass through conversion array 41, error value $g_1$, from register 62. That is, selector circuit 104 obtains the error value from the first register which is operative at the instant stage of the conversion procedure. Once selector circuit 104 has obtained the first error value from the first operative register, it selects that register and alternate registers to input their values to interpolator delay line 106 of interpolator circuit 108 at a clock rate set by clock 109. Interpolator circuit 108 performs a convolution operation on the data from selector circuit 104. Using the set of interpolator weights $a_{-3}$, $a_{-2}$, $a_{-1}$, $a_1$, $a_2$ and $a_3$, selected to provide the appropriate weights for multipliers 110, interpolator circuit 108 ideally provides the best possible estimate of the error value intermediate to the two values multiplied by weight $a_{-1}$ and by weight $a_1$. Interpolator weights can be selected by conventional methods such as described in Schafer, R. W., and Rabiner, L. R., "A Digital Signal Processing Approach to Interpolation," Proc. IEEE, vol. 61, pp. 692–702 (1973). After the first set of alternating values is processed by interpolator circuit 108, interpolator delay line 106 is flushed by zero generator 120. The second set of remaining error values is then provided by selector circuit 104 to interpolator circuit 108 where it is processed in an identical manner.

Delay line 106 is flushed after each use by zero generator 120: after the last alternate error value of the first set accessed at tap 118 and before the second set of remaining error values is processed, zero generator 120 fills delay line 106 with zeros. Output to line 116 begins when the first alternate value is accessed by tap 118: that value is multiplied by weight $a_{-3}$ while zero values previously entered by zero generator 120 are accessed at the other taps to multipliers 110. Line 122 samples an input error value which is one-half of a clock period ahead of the interpolator estimate being output on line 116; although this input error value is sampled simultaneously with the output of summing bus 114 on line 116, delay circuit 124 delays this error value by one-half a clock period before it is placed on line 126 by adder 128.

Thus the values on line 126 are output at twice the rate of the input to delay line 106. Each value on line 126 is decreased by one-half by multiplier 130. These values are provided to adder and alignment circuit 132 which aligns the values such that input error value $g_1$ is eventually provided as transformed value $g_1'$ to register 134.

A greater number of values are provided from transformation circuit 72 than the number of error values provided to it due to "build-up" and "decay" values obtained during the convolution operation described above. The number of output values on line 116 equals the sum of the interpolator delay line tap count that is, the number of multipliers 110, plus the number of input error values and zero flush values, less one. Delay circuit 124 injects additional values, including the input error set, intermediate to the values generated on line 116. Extension registers 136, 137 and registers 134, 138, 140 ... 142 are initially cleared by zero generator 133. The output of multiplier 130 is positioned by adder and alignment circuit 132 so that the $g_1$ component which will appear scaled by one-half is incremented into register 134 associated with transformed error value $g_1'$. Since alternate error values are input by selector circuit 104, the next input value to appear at the output of multiplier 130 from line 122 will be $g_3$ scaled by one-half. This value is incremented into register 140 which is associated with transformed error value $g_3'$. Intermediate to these two values is a value produced by the convolution operation: intermediate registers such as register 138 will receive line 116 values for transformed error value $g_2'$ scaled by one-half. Portions of extension registers 136, 137 are also incremented in this operation.

An equivalent set of operations occurs as the alternate set of inputs from selector circuit 104 is provided to interpolator circuit 108. Input error value $g_2$ scaled by one-half increments register 138 which is associated with transformed error value $g_2'$. The scaled input error values $g_2$, $g_4$ and so on increment registers associated with transformed error values $g_2'$, $g_4'$ and so on. The scaled interpolator values from line 116 now increment the registers associated with transformed error values $g_1'$, $g_3'$ and so forth. As before, some extension registers 136 and 137 will also be incremented by this process.

Some of the growth in size of the transformed error set relative to the size of the original error set is associated with the convolutional nature of the interpolation processor. The merging operation at adder 128 would more than double the size of the transformed error set since two input values to circuit 132 are generated for each input value to delay line 106. Growth in the transformed error set size due to doubling—but not due to convolutional stretching—is avoided by the alternate error value processing scheme described above.

Instead of a formal interpolator as shown in FIG. 7, smoothing device 148, shown in phantom, such as a digital low-pass or bandpass filter might be used instead of interpolator circuit 108, line 122, and adder 128. Multiplier 130 would contain an appropriate scaling value. Alternate values from selector circuit 104 are interspersed with zeros by zero generator 120 and fed to smoothing device 148. The output of smoothing device 148 is appropriately scaled by multiplier 130 and provided to line 131. Of the values that are provided to line 131, alternate filter output values are associated with the nonzero input value set. The intermediate output values are associated with the zero input set and correspond to interpolated values.

The Discrete Fourier Transform of the transformed error set matches the Transform of the original error set to a degree determined by the properties of the transformation circuit. The set of frequencies over which the match occurs extends from zero up to some cutoff frequency value which is always less than one-half of the fold-over frequency. The fold-over frequency is one-half of the sampling rate of the signal processor utilizing the corrected weight sets. The fold-over frequency represents the absolute frequency upper limit for all digital signal processing. The frequency response of the quantized weight set can be made to match that of the original weight set very precisely up to the cutoff frequency. The match may or may not be satisfactory beyond this frequency value.

There are at least two procedures for overcoming this limitation. The sampling rate could be increased by a factor of two so that the combination of input filter and sampling rate results in negligible signal content above one-half of the fold-over frequency. The quantized processor behavior would then be under strict control at all frequencies of significant signal energy content.

If the sampling rate is fixed, e.g., because of limitations in A/D conversion, or for some other reason the sampling rate cannot be increased, the sampling rate can be artificially increased by multiplying the sampling rate within the signal processing system. A device such as a quantized interpolator can be used to double the sampling rate; a quantized decimator can then be used to return the artificially high rate to the original rate after the signal processor has processed the signals.

An example of an initial weight set and a set of weights converted according to this invention are shown in Tables I and II, respectively.

TABLE I

INITIAL WEIGHT SET
(SYMMETRIC ABOUT INDEX 23)

| Index | Weight Value |
|---|---|
| 0 | −8.693035 E-3 |
| 1 | 0.000000 E 0 |
| 2 | 2.840070 E-3 |
| 3 | 0.000000 E 0 |
| 4 | −1.220171 E-2 |
| 5 | 0.000000 E 0 |
| 6 | 2.328647 E-2 |
| 7 | 0.000000 E 0 |
| 8 | −1.652047 E-2 |
| 9 | 0.000000 E 0 |
| 10 | 3.732680 E-2 |
| 11 | 0.000000 E 0 |
| 12 | −2.145636 E-2 |
| 13 | 0.000000 E 0 |
| 14 | 5.649740 E-2 |
| 15 | 0.000000 E 0 |
| 16 | −1.107322 E-1 |
| 17 | 0.000000 E 0 |
| 18 | 1.133456 E-1 |
| 19 | 0.000000 E 0 |
| 20 | −1.444559 E-1 |
| 21 | 0.000000 E 0 |
| 22 | 8.041280 E-1 |
| 23 | 1.000000 E 0 |

TABLE II

CONVERTED WEIGHT SETS
(SYMMETRIC ABOUT INDEX 40)

| Index | $Q_1$ | $Q_2$ |
|---|---|---|
| 0 | Zero | 14.00 |
| 1 | Zero | Zero |
| 2 | Zero | −13.00 |
| 3 | Zero | Zero |
| 4 | Zero | 13.00 |
| 5 | Zero | Zero |
| 6 | Zero | −12.00 |
| 7 | Zero | Zero |
| 8 | Zero | 12.00 |
| 9 | Zero | Zero |
| 10 | Zero | −12.00 |
| 11 | −13.00 | −13.00 |
| 12 | 13.00 | 11.00 |
| 13 | 14.00 | 13.00 |
| 14 | −12.00 | −11.00 |
| 15 | −12.00 | −13.00 |
| 16 | 12.00 | 10.00 |
| 17 | −7.00 | −11.00 |
| 18 | −13.00 | −9.00 |
| 19 | 8.00 | −11.00 |
| 20 | 12.00 | 9.00 |
| 21 | −6.00 | 9.00 |
| 22 | −12.00 | −9.00 |
| 23 | 5.00 | −8.00 |
| 24 | 10.00 | −8.00 |
| 25 | −6.00 | 14.00 |
| 26 | −10.00 | 9.00 |
| 27 | 5.00 | 8.00 |
| 28 | 13.00 | 9.00 |
| 29 | −6.00 | −8.00 |
| 30 | 9.00 | −7.00 |
| 31 | 4.00 | −8.00 |
| 32 | −9.00 | 7.00 |
| 33 | −3.00 | 7.00 |
| 34 | 10.00 | Zero |
| 35 | 3.00 | −7.00 |
| 36 | −9.00 | −8.00 |
| 37 | −3.00 | −9.00 |
| 38 | 6.00 | −4.00 |
| 39 | 0.00 | −3.00 |
| 40* | 5.00 | −3.00 |

*Additional zero shift to be added at this index.

The initial weight set shown in Table I is symmetric about index 23 such that the weight value at index 24 is 8.041280 E-1 and the weight value at index 25 is 0.000000; the exponent for each weight value is indicated by the digit following "E". Similarly, the converted weight values in Table II are symmetric about index 40. The word "zero" indicates that a value of zero is produced from the shift device at that index; 0.00 indicates that a zero shift is imposed upon the signal value entering the shift device, i.e., the signal value itself is produced from that shift device.

The initial weight set is implemented using a delay line and forty-seven multipliers in an arrangement such as shown in FIG. 1. The converted weight sets $Q_1$ and $Q_2$ can be implemented using eighty-one shift devices for each converted weight set, such as shown in FIG. 2.

Implementation of the converted weight sets requires an additional zero-shift value at index 40 such as illustrated by shift device 38, FIG. 2: the initial weight value at index 23 is changed to a value of zero before the initial weight set is converted according to the operation shown in FIG. 4, and therefore the original value must be restored. For most conversions according to this invention it has been empirically determined that changing the central initial weight value to zero improves the accuracy of the conversion.

The frequency response of the initial weight set shown in Table I to a signal is shown in FIG. 8 as curve 150. The frequency response of converted weight sets $Q_1$ and $Q_2$, Table II, are indicated by curve 152. Curves 150 and 152 are closely matched in response in decibels up to the normalized frequency of approximately 0.5, where 1.0 represents the fold-over frequency. For example, where the maximum frequency of the data is 3000 Hz, a typical sampling rate is twice the maximum data frequency or 6000 Hz. The foldover frequency is one-half the sampling rate or 3000 Hz; 3000 Hz is normalized to the value of 1.0.

When it is desired that the improved signal processor implementing the converted sets of weights match the response of a conventional signal processor using the initial set of weights, the sampling rate can be doubled. For example, signal values can be provided at a rate of 12,000 Hz instead of 6,000 Hz. The lower half of the fold-over frequency becomes 0-3000 Hz, which matches the frequency span of the signal values.

The converted weight sets of Table II are developed by converting the initial weight set of Table I using two conversion arrays such as conversion arrays 41, 41a of conversion apparatus 39a, FIG. 4. Interpolation circuits including multipliers similar to multipliers 110, FIG. 7, implement the interpolation weight set shown in Table III.

TABLE III

| INTERPOLATOR WEIGHT SET (SYMMETRIC ABOUT INDEX 37) | |
|---|---|
| Index | Weight Value |
| 0 | 8.539050E-4 |
| 1 | 0.000000E 0 |
| 2 | -1.094330E-3 |
| 3 | 0.000000E 0 |
| 4 | 1.760830E-3 |
| 5 | 0.000000E 0 |
| 6 | -2.672815E-3 |
| 7 | 0.000000E 0 |
| 8 | 3.874815E-3 |
| 9 | 0.000000E 0 |
| 10 | -5.445740E-3 |
| 11 | 0.000000E 0 |
| 12 | 7.437160E-3 |
| 13 | 0.000000E 0 |
| 14 | -9.950740E-3 |
| 15 | 0.000000E 0 |
| 16 | 1.309665E-2 |
| 17 | 0.000000E 0 |
| 18 | -1.701551E-2 |
| 19 | 0.000000E 0 |
| 20 | 2.190686E-2 |
| 21 | 0.000000E 0 |
| 22 | -2.807552E-2 |
| 23 | 0.000000E 0 |
| 24 | 3.600032E-2 |
| 25 | 0.000000E 0 |
| 26 | -4.650686E-2 |
| 27 | 0.000000E 0 |
| 28 | 6.115556E-2 |
| 29 | 0.000000E 0 |
| 30 | -8.331476E-2 |
| 31 | 0.000000E 0 |
| 32 | 1.217730E-1 |
| 33 | 0.000000E 0 |
| 34 | -2.0883525E-1 |
| 35 | 0.000000E 0 |
| 36 | 6.354887E-1 |
| 37 | 0.000000E 0 |

The initial weight set was iteratively processed through the two conversion arrays for twelve conversion operations. The first eleven operations involved quantization and error transformation in a current conversion array and incrementation of the storage registers of the next conversion array. On the twelfth and last operation, only a quantization was performed; the error values were simply discarded. Table IV shows the peak error values and the number of transformed error values generated by each operation. The magnitude of the peak error value tends toward smaller values but is not monotonic during successive operations. The transformed error set grows by 74 terms after each cycle but many of these values placed in the extension registers are very small. After the eleventh operation there were 861 accessed error registers. Of those 861 error values, only 81 were quantized to a nonzero value in the twelfth and last operation. Similarly, of the 787 error values generated during the tenth operation, only 59 quantized values remained after quantization in the eleventh operation. $Q_1$ and $Q_2$ therefore contained 59 and 81 terms, respectively, as shown in Table II; twenty-two zero values were added to $Q_1$ to provide that weight set with the same number of terms as $Q_2$.

TABLE IV

| CONVERSION OPERATION DATA | | |
|---|---|---|
| Operation No. | Peak Error dB re Unity | No. Transformed Error Values Produced |
| 1 | -14.16 | 121 |
| 2 | -31.35 | 195 |
| 3 | -35.07 | 269 |
| 4 | -38.88 | 343 |
| 5 | -40.68 | 417 |
| 6 | -46.21 | 491 |
| 7 | -47.08 | 565 |
| 8 | -46.93 | 639 |
| 9 | -46.82 | 713 |
| 10 | -46.77 | 787 |
| 11 | -46.00 | 861 [59]* |
| 12 (last) | -45.98 | — [81]* |

*No. quantized values.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A conversion apparatus for quantizing a set of weights for a weighted sum signal processing system, comprising:
   a predetermined number of conversion arrays operated in succession, each having:
   means for storing a plurality of values to be converted;
   means for quantizing the values to be converted to produce a set of discrete values and a set of error values and for replacing the contents of said means for storing with the set of discrete values; and
   transformation means for combining the set of error values with a set of preselected transformation weights to form a transformed error set; and
   transfer means, responsive to each said conversion array, for successively combining the transformed error set most recently formed with the contents of a successive said conversion array and for monitoring the successively produced sets of error values, said transfer means halting the successive conversions and combinations when a predetermined condition is satisfied.

2. The apparatus of claim 1 in which each said transformation means includes:
   interpolation means for combining selected values with said set of interpolator weights;

first means for selecting a first group of alternate values from each error value set which are combined by said interpolation means to form a first interpolated group;

second means for selecting a second group of alternate error values, consisting of the remaining error values in that error value set, which are combined by said interpolation means to form a second interpolated group; and adder means for combining the first and second interpolated groups to form a transformed set.

3. The apparatus of claim 2 in which said interpolation means includes a smoothing device.

4. The apparatus of claim 2 in which each said transformation means further includes means for providing a plurality of zero values to said interpolation means.

5. The apparatus of claim 2 in which said adder means includes means for reducing by a predetermined amount the magnitude of each value of each interpolated group.

6. The apparatus of claim 2 in which each error value set has a center position and said transformation means includes means for aligning the error value set into a transformed error set having a center position corresponding in alignment with the center position of that error value set.

7. The apparatus of claim 6 in which said transfer means places the center position of the transformed error set into the same position in said successive means for storing as the position in which the previous transformed error set was placed.

8. The apparatus of claim 1 in which each said error set represents the difference between the quantized set and the set which was quantized.

9. The apparatus of claim 8 in which the contents of a storage means that is quantized, the resulting quantized set, and the resulting error set have the same number of values.

10. The apparatus of claim 1 in which said means for quantizing selects a discrete value from L cells of numerical values according to the formulas $$C_k = 10^{\frac{-P}{20}(k-1)}$$

$$B_k = 10^{\frac{-P}{40}(2k-1)}$$

$$k = 1, 2, 3, \ldots, L - 1$$

and $$C_L = 0$$

where $C_k$ is the discrete value for the $k^{th}$ cell, $B_k$ is the lower boundary of the kth cell, P is a quantization parameter selected to provide a desired result, and L is the number of said cells.

11. The apparatus of claim 10 in which $$P = 20 \log_{10}(p)$$

where p is the radix of the numerical system.

12. The apparatus of claim 11 in which the numerical system is a binary system and $$p = 2.$$

13. The apparatus of claim 1 in which the contents of each said means for storing is requantized at least once.

14. The apparatus of claim 1 in which each discrete value produced by said means for quantizing is represented by a single non-zero digit in a numerical system.

15. A method of quantizing an initial set of weights for a weighted-sum signal processing system comprising:

quantizing the initial set of weights to obtain a first quantized set and a first error set;

placing the first quantized set into a first storage means of a predetermined number of storage means;

transforming the first error set into a first transformed error set;

producing and entering successive quantized sets into the remaining storage means by iteratively, until a quantized set is placed into the last of the storage means, quantizing the transformed error set resulting from the most recent transformation to obtain a resulting quantized set and a resulting error set, placing the resulting quantized set into a succeeding storage means, and transforming the resulting error set into a resulting transformed error set;

incrementing the most recently transformed error set into one of the storage means now occupied by a quantized set; and repeatedly, until a predetermined condition is satisfied, quantizing the contents of each successive storage means to obtain a revised quantized set and a revised error set, replacing the contents of that storage means with the revised quantized set, transforming the revised error set into a revised transformed error set, and incrementing the revised transformed error set into the next storage means.

16. The method of claim 15 in which quantizing provides a set of values each represented by a discrete value of a set of discrete values.

17. The method of claim 16 in which each discrete value is represented by a single nonzero digit in a numerical system.

18. The method of claim 17 in which the discrete values are selected from L cells of numerical values according to the formulas $$C_k = 10^{\frac{-P}{20}(k-1)}$$

$$B_k = 10^{\frac{-P}{40}(2k-1)}$$

$$k = 1, 2, 3, \ldots, L - 1$$

and $$C_L = 0$$

where $C_k$ is the discrete value for the $k^{th}$ cell, $B_k$ is the lower boundary of the kth cell, P is a quantization parameter selected to provide a desired result, and L is the number of cells.

19. The method of claim 18 in which $$P = 20 \log_{10}(p)$$

where p is the radix of the numerical system.

20. The method of claim 19 in which the numerical system is a binary system and $$p = 2.$$

21. The method of claim 15 in which transforming includes combining the error values of each error set with a set of interpolator weights.

22. The method of claim 21 in which:
a first group of alternate error values is selected from each error set and is combined with the set of interpolator weights in a first interpolation procedure to form a first interpolated group;
a second group of alternate error values, consisting of the remaining error values in that error set, is selected and combined with the set of interpolator weights in a second interpolation procedure to form a second interpolated group; and
the first and second interpolated groups are combined to form a transformed error set.

23. The method of claim 22 in which each error set has a center position and is transformed into a transformed error set having a center position corresponding in alignment with the center position of that error set, the transformed error set having a greater number of values distributed about the corresponding center position.

24. The method of claim 23 in which adding the transformed error set into the next storage means places the center position of the transformed error set into the same position as the position in which the previous transformed error set was placed.

25. The method of claim 15 in which each said error set represents the difference between the quantized set and the set which was quantized.

26. The method of claim 25 in which the contents of a storage means that is quantized, the resulting quantized set, and the resulting error set have the same number of values.

27. The method of claim 15 in which repeatedly quantizing, replacing, transforming and adding includes requantizing at least once the contents of each storage means.

28. A method of quantizing an initial set of weight signals for a weighted-sum signal processing system comprising:
quantizing the initial set of weight signals to obtain a first quantized set of signals and a first error set of signals;
placing the first quantized set into a first storage means;
transforming the first error set into a first transformed error set of signals;
quantizing the first transformed error set to obtain a second quantized set and a second error set;
placing the second quantized set into a second storage means;
transforming the second error set into a second transformed error set;
incrementing the second transformed error set into the first storage means; and
repeatedly, until a predetermined condition is satisfied, quantizing the contents of each storage means to obtain a resulting quantized set and a resulting error set, replacing the contents of that storage means with the resulting quantized set, transforming the resulting error set into a resulting transformed error set, and incrementing the resulting transformed error set into the next storage means.

* * * * *